United States Patent
Otsuka

(10) Patent No.: US 8,608,350 B2
(45) Date of Patent: Dec. 17, 2013

(54) LIGHTING DEVICE

(75) Inventor: Koji Otsuka, Niiza (JP)

(73) Assignee: Sanken Electric Co., Ltd., Niiza-shi (JP)

( * ) Notice: Subject to any disclaimer, the term of this patent is extended or adjusted under 35 U.S.C. 154(b) by 342 days.

(21) Appl. No.: 13/208,014

(22) Filed: Aug. 11, 2011

(65) Prior Publication Data

US 2012/0063141 A1 Mar. 15, 2012

(30) Foreign Application Priority Data

Aug. 12, 2010 (JP) ................................. 2010-180871

(51) Int. Cl.
*F21V 5/04* (2006.01)

(52) U.S. Cl.
USPC ....... 362/331; 362/244; 362/246; 362/311.02

(58) Field of Classification Search
USPC ................. 362/244, 245, 246, 236, 235, 237, 362/311.02, 331, 335–340, 268
See application file for complete search history.

(56) References Cited

U.S. PATENT DOCUMENTS

| | | | | |
|---|---|---|---|---|
| 4,345,308 A * | 8/1982 | Mouyard et al. | ............... | 362/332 |
| 6,367,950 B1 * | 4/2002 | Yamada et al. | ............... | 362/245 |
| 7,918,583 B2 * | 4/2011 | Chakmakjian et al. | ........ | 362/240 |
| 8,246,212 B2 * | 8/2012 | Schaefer et al. | ............. | 362/294 |
| 2008/0043466 A1 * | 2/2008 | Chakmakjian et al. | ........ | 362/237 |

FOREIGN PATENT DOCUMENTS

JP 2007-265722 10/2007

* cited by examiner

*Primary Examiner* — Bao Q Truong
(74) *Attorney, Agent, or Firm* — Oblon, Spivak, McClelland, Maier & Neustadt, L.L.P.

(57) ABSTRACT

A lighting device is provided to include a plurality of lens bodies. The connecting portion connecting the plurality of lens bodies includes a first major surface and a second major surface opposite to the first major surface. The first major surface is in contact with the lateral portion at a first contact under an outer edge of the leading lens. The second major surface is in contact with the lateral portion at a second contact located below the first contact. The first contact is located outside of a point of intersection along the first major surface with respect to the center of each lens body, the point of intersection at which an extraction of the first major surface intersects with an extension of a ray of the emitted light which is incident on the light incident surface and is projected on the second contact.

4 Claims, 5 Drawing Sheets

LIGHTING DEVICE

CROSS-REFERENCE TO RELATED APPLICATION

This application is based upon and claims the benefit of priority from Japanese Patent Application No. 2010-180871, filed Aug. 12, 2010; the entire contents of which are incorporated herein by reference.

BACKGROUND OF THE INVENTION

1. Field of the Invention

The present invention relates to a lighting device for radiating light emitted from a plurality of light emitting elements.

2. Description of the Related Art

Some lighting devices used in recent years use light emitting elements, such as light emitting diodes (LEDs), as light sources. In order to use light emitting elements emitting light in a radial fashion, such as LEDs, as light sources of lighting devices radiating light controlled in a predetermined direction, it is necessary to focus light from the light emitting elements.

In such a case, a lighting device is proposed, including a plurality of light emitting elements and a plurality of lenses which are connected to each other and focus light emitted from the light emitting elements (JP2007-265722 A2).

SUMMARY OF THE INVENTION

However, in such a conventional lighting device, when light from the light emitting elements is incident on a connecting portion connecting the lenses, the light is fully reflected on the surface of the connecting portion and is not radiated in some cases, or the incident light is not emitted in a predetermined direction in some cases. Accordingly, the light from the light emitting elements is not effectively extracted, and light radiated in the predetermined direction is reduced (hereinafter, referred to as a light loss).

In the light of the aforementioned problem, an object of the present invention is to provide a lighting device including a plurality of lenses which are connected to each other and emit light incident from light emitting elements with the light loss reduced and the degradation in the light directional characteristic prevented.

A lighting device according to a first aspect of the present invention includes a plurality of bulk-type lens bodies and a connecting portion connecting the plurality of lens bodies. Each of the lens bodies includes: a light incident surface on which light emitted from a light emitting element is incident; a light exit surface which is opposite to the light incident surface and is provided with a ring-shaped leading lens at the outer periphery; and an lateral portion connecting the light incident surface and the light exit surface. The connecting portion connecting the plurality of lens bodies includes a first major surface and a second major surface opposite to the first major surface. The first major surface is in contact with the lateral portion at a first contact under an outer edge of the leading lens. The second major surface is in contact with the lateral portion at a second contact located below the first contact. In such a manner, the connecting portion connects the plurality of lens bodies. The first contact is located outside of a point of intersection along the first major surface with respect to the center of each lens body, the point of intersection at which an extraction of the first major surface intersects with an extension of a ray of the emitted light which is incident on the light incident surface and is projected on the second contact.

According to the first aspect of the present invention, it is possible to provide a lighting device including a plurality of lenses which are connected and emit light incident from light emitting elements with the light loss reduced and the degradation in the light directional characteristic prevented.

DETAILED DESCRIPTION OF THE EMBODIMENTS

Figure 1:
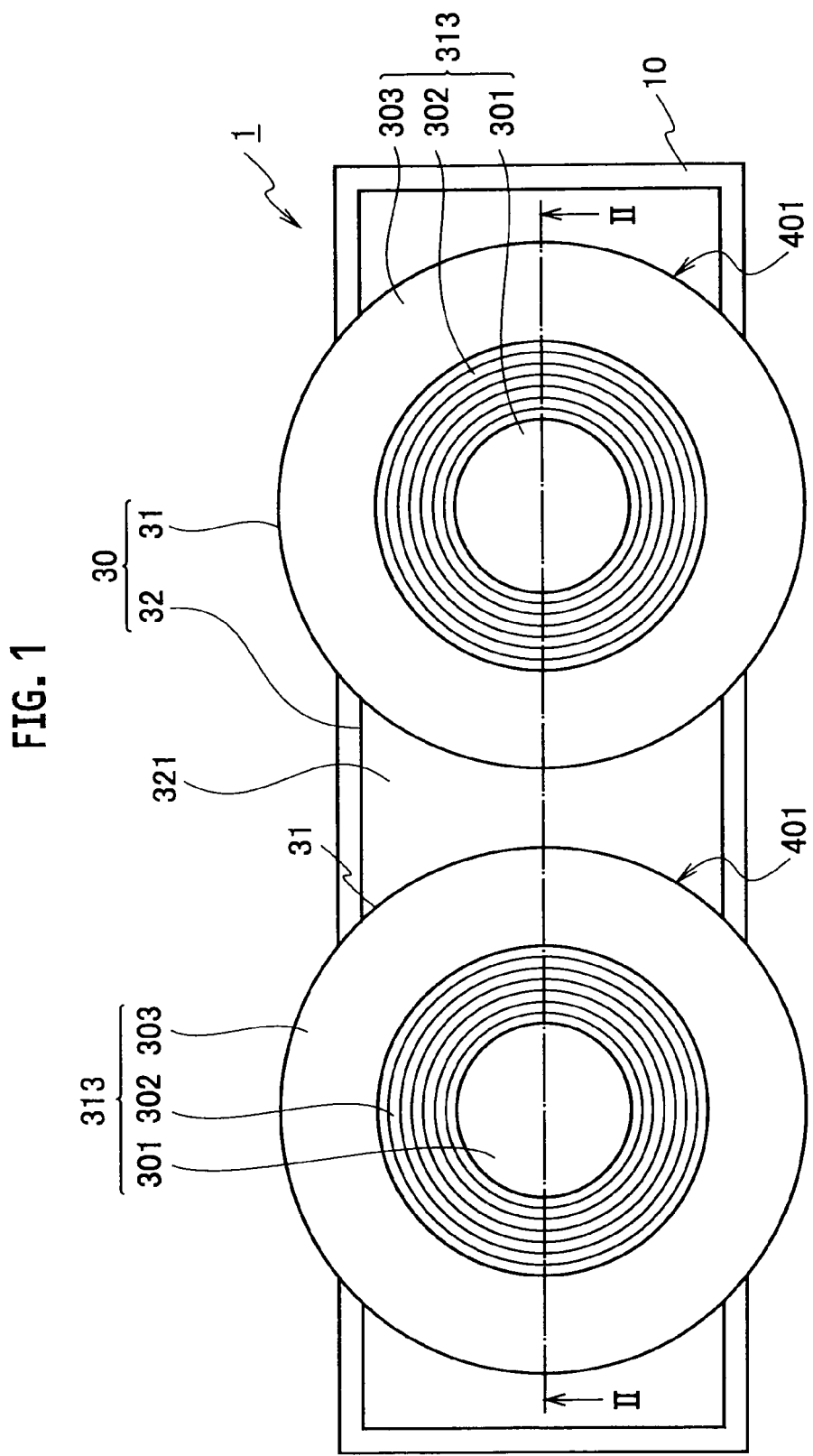
FIG. 1 is a plan view of a lighting device according to an embodiment.

Next, a description is given of an embodiment of the present invention with reference to the drawings. In the following description of the drawings, same or similar portions are given same or similar reference numerals. It should be noted that the drawings are schematic and that the relation between thickness and planer dimensions, the proportion of thicknesses of layers, and the like are different from the real ones. Accordingly, specific thicknesses and dimensions should be determined with reference to the following description. It is certain that some portions have different dimensional relations and proportions through the drawings.

The embodiment illustrated below illustrates devices and methods to embody the technical idea of the present invention by example. The technical ideas of the present invention do not specify the materials, shapes, structures, arrangements, and the like of the constituent components to the followings. The embodiment of the present invention can be variously changed within the scope of claims.

Figure 2:
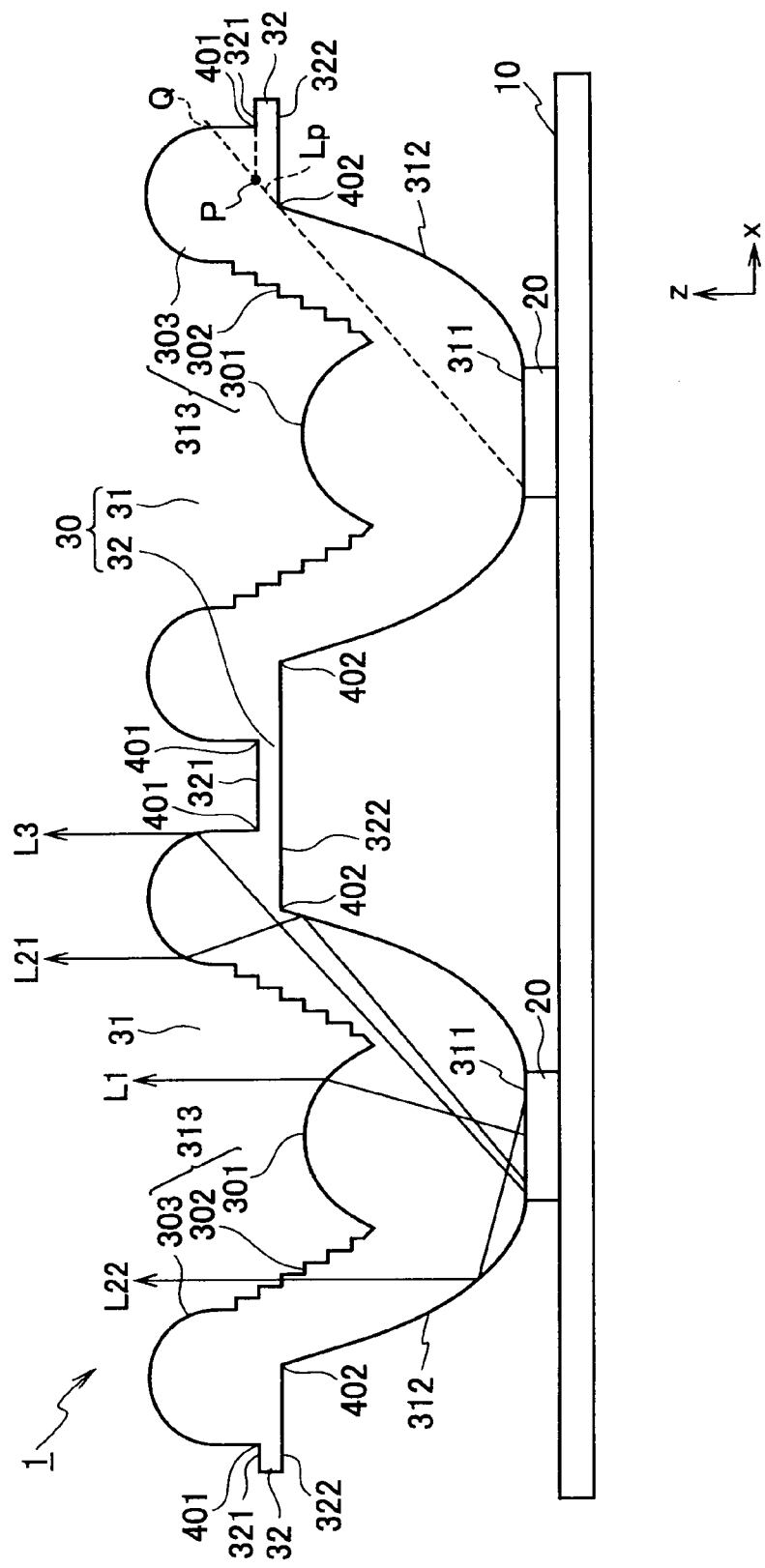
FIG. 2 is a cross-sectional view taken along a line II-II of FIG. 1.

As illustrated in FIGS. 1 and 2, a lighting device 1 according to the embodiment includes a plurality of light emitting elements 20 located on a substrate 10. The light emitting elements 20 are light emitting sources such as LEDs, for example. On the light emitting elements 20, a lens 30 on which light emitted from the light emitting elements 20 is incident is located. The lens 30 concentrates light emitted from the light emitting elements 20 and emits the light in a predetermined direction. As illustrated in FIG. 2, the direction that the substrate 10 extends is a direction x, and the thickness direction of the substrate 10 is a direction z. Accordingly, the direction z is a direction vertical in relation to the paper surface in FIG. 1. The light emitted from the lens 30 is concentrated in the direction z.

As illustrated in FIG. 1, each lens body 31 has a light incident surface 311 and a light exit surface 313 which are circular. As illustrated in FIG. 2, the cross-sectional shape of a lateral portion 312 taken along a plane perpendicular to the light incident and light exit surfaces 311 and 312 has a bowl shape wider in the light exit surface 313 side than in the light incident surface 311 side.

The lens 30 is composed of a plurality of bulk-type lens bodies 31 and a connecting portion 32 connecting the plurality of lens bodies 31.

Each of the lens bodies 31 includes the light incident surface 311, the light exit surface 313 opposite to the light incident surface 311, and the lateral portion 312. Light emitted from each of the light emitting elements 20 is incident on the corresponding light incident surface 311. At the outer periphery of the light exit surface 313, a ring-shaped leading lens 303 is formed. The lateral portion 312 connects the light incident surface 311 and light exit surface 313. Light which is emitted from the light emitting element 20 and incident on the lens body 31 is emitted out of the lens 30 through the light exit surface 313.

As illustrated in FIG. 2, the light exit surface 313 has a recess formed at the center. At the bottom of the recess formed in the light exit surface 313, a central lens 301 is located. In the sidewall of the recess, a stepped lens 302 having steps is provided.

The central lens 301 is a spherical convex with the top directed in the direction that light is concentrated. The top of the central lens 301 is located below the top of the leading lens 303. The stepped lens 302 is formed between the periphery of the central lens 301 and the leading lens 303 in a step-like shape. The stepped lens 302 is composed of faces substantially parallel to or perpendicular to the substrate surface. Accordingly, light which is reflected on the lateral portion 312 and is then emitted out of the lens 30 through the stepped lens 302 is concentrated in the predetermined direction, that is, in the direction z.

The connecting portion 32 includes a first major surface 321 and a second major surface 322 opposite to the first major surface 321. The first major surface 321 is in contact with the lateral portion 312 of each lens body 31 at a first contact 401 under the outer edge of the leading lens 303. The second major surface 322 is in contact with the lateral portion 312 at a second contact 402 below the first contact 401 along the lateral portion 312.

As illustrated in FIG. 2, an intersection point P is a point of intersection of an extension of the first major surface 321 of the connecting portion 32 with an extension Lp of a ray of light from the light emitting element 20 which is incident on the light incident surface 311 of the lens body 31 and strikes the second contact 402. At this time, the first contact 401 is positioned outside of the intersection point P along the first major surface 321 with respect to the center of the lens body 31.

In the example illustrated in FIG. 2, the light emitting surfaces of the light emitting elements 20 are in contact with the light incident surfaces 311 of the lens bodies 31, and light emitted from each light emitting element 20 is efficiently incident on the corresponding lens body 31. Light entering the lens body 31 through the light incident surface 311 is directly emitted through the light exit surface 313 like a light ray L1. Alternatively, light entering the lens body 31 through the light incident surface 311 is reflected on the lateral portion 312 and then emitted through the light exit surface 313 like light rays L21 and L22.

Light reflected on the lateral portion 312 is emitted out of the lens 30 through the stepped lens 302 or leading lens 303 to be concentrated in the direction z. Light entering the central lens 301 through the light incident surface 311 is emitted from the central lens 301 to the outside of the lens 30 to be concentrated in the direction z. In short, all the rays of light incident on the lens body 31 are concentrated in the direction z. The lighting device 1 has a directional characteristic of light with the intensity highest right over the light device 1.

In the lighting device 1 according to the embodiment of the present invention, as described below, light entering the lens body 31 through the incident surface 311 does not enter the connecting portion 32.

Figure 3:
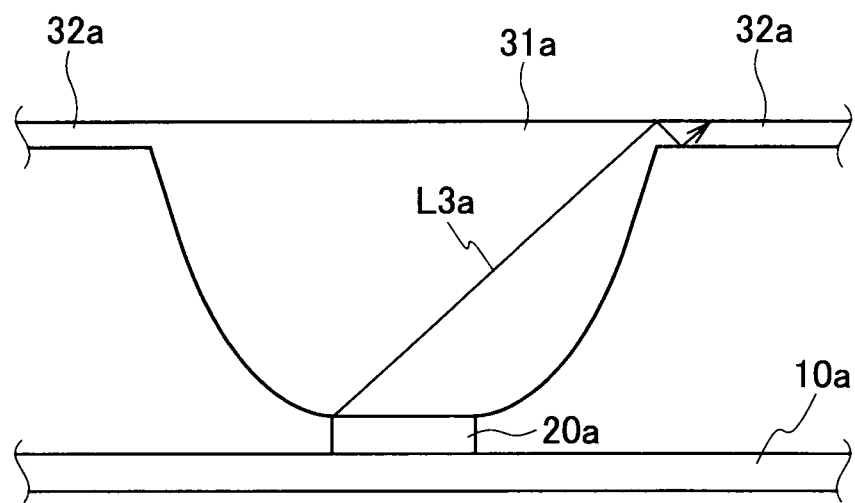
FIG. 3 is a cross-sectional view illustrating a structure of a lighting device according to a related art.

As for a related technique in which a plurality of lens bodies 31a are connected with a connecting portion 32a, FIG. 3 illustrates an example in which light emitted from each light emitting element 20a located on a substrate 10a is incident on the corresponding lens body 31a. The light incident on the light incident surface of the lens body 31a is most likely to enter the connecting portion 32a in the following case: a light ray L3a emitted from the edge of the light emitting element 20a enters the connecting portion 32a above a lateral portion on the opposite side of the incident surface. The light ray L3a entering the connecting portion 32a is totally reflected on the surface of the connecting portion 32a and is not emitted out of the connecting portion 32a as illustrated in FIG. 3, for example. Alternatively, the light ray L3a entering the connecting portion 32a is not emitted in the predetermined direction, thus causing degradation of the directional characteristic of light.

On the other hand, in the lens 30 illustrated in FIG. 2, the light ray L3 emitted from the edge of the light emitting element 20 passes through the leading lens 303 to be emitted out of the lens 30 without entering the connecting portion 32.

As illustrated in FIG. 2, the reason why light emitted from the light emitting element 20 does not enter the connecting portion 32 is that the first contact 401 is located outside of the intersection point P, at which the extension of the first major surface 321 intersects with the extension Lp of the light ray from the light emitting element 20 which is incident on the light incident surface 311 and then directly strikes the second contact 402, along the first major surface 321.

In other words, the lens body 31 is connected to the first major surface 321 of the connecting portion 32 in a shadow region which is not irradiated by the light incident on the light incident surface 311. The light from the light emitting element 20 is therefore projected on any one of the light exit surface 313 and the lateral portion 312 of the lens body 31.

As illustrated in FIG. 2, an intersection point Q is a point of intersection of the extension Lp of the light ray from the light emitting element 20 with the lateral portion 312. At this time, the thickness of the connecting portion 32, that is, the distance between the first and second major surfaces 321 and 322, is shorter than the distance of the shadow region on which the light incident on the incident surface 311 is not irradiated, that is, the distance between the intersection point Q and the second major surface 322.

By previously optimizing the shape of the leading lens 303 and lateral portion 312, the light ray L3 which is reflected on the lateral portion 312 to enter the leading lens 303 is concentrated in a predetermined direction, or the direction z illustrated in FIG. 2. The cross-sectional shape of the leading lens 303 taken along the light incident surface 311 is substantially circular.

Preferably, the connecting portion 32 is connected to an upper part of the lens body 31 or to a part near the leading lens 303. If the connecting portion 32 is connected to a lower part of the lens body 31, the angle between the light incident surface 311 and lateral portion 312 needs to be set larger in order to prevent the light entering the lens body 31 through the light incident surface 311 from entering the connecting portion 32. This will result in an increase in area of the lens 30.

The manufacturing cost of the lens 30 can be reduced by integrally molding the plurality of lens bodies 31 and connecting portion 32 to manufacture the lens 30. As illustrated in FIG. 2, the angle between the outer side of the lateral portion 312 of the lens body 31 and the first major surface 321 of the connecting portion 32 is set to not less than 90 degrees at the first contact 401. The lens 30 can be therefore molded from above. Furthermore, the angle between the outside of the lateral portion 312 of the lens body 31 and the second major surface 322 of the connecting portion 32 is set to not less than 90 degrees at the second contact 402. The lens 30 can be therefore molded from below. Accordingly, the plurality of lens bodies 31 and the connecting portion 32 can be integrally molded.

The lens 30 can be made of a transparent material easily processed, for example, such as polycarbonate resin, acrylic resin, or epoxy resin. The material of the lens 30 needs to be selected according to the type of the light emitted from the light emitting elements 20, for example, in the light of the resistance to ultraviolet light. For example, silicone resin is suitable for the material of the lens 30 because the silicone resin is soft and highly resistant to ultraviolet rays.

As described above, in the lighting device 1 according to the embodiment of the present invention, all the rays of light entering the lens body 31 through the light incident surface 311 are emitted from the light exit surface 313 without entering the connecting portion 32 and are then concentrated in a predetermined direction. It is therefore possible to implement the lighting device 1 including the plurality of lens bodies 32 emitting light from the individual light emitting elements 20 and the connecting portion 32 with the loss of light reduced and the degradation in the directional characteristic of light prevented.

Modification

Figure 4:
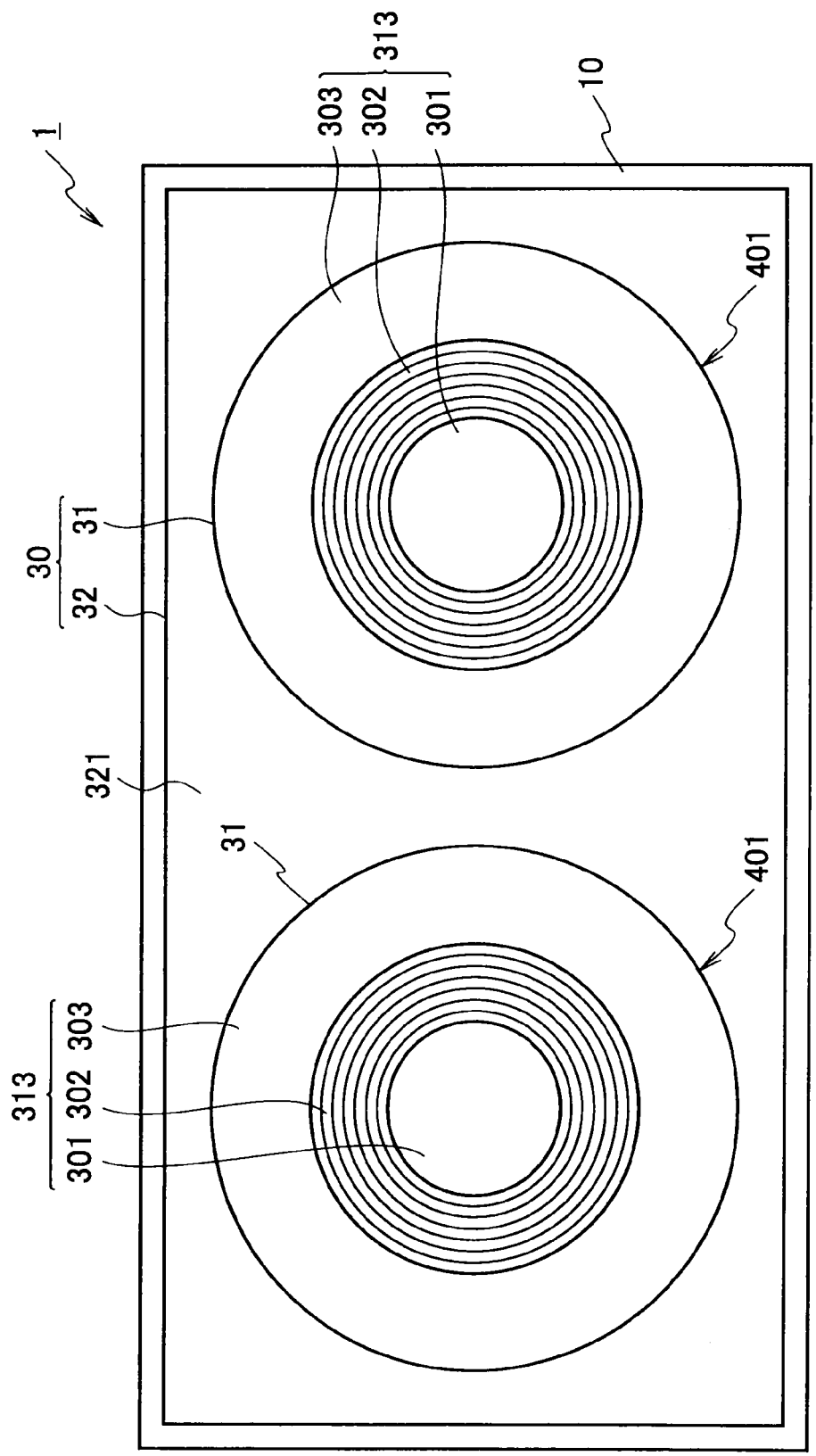
FIG. 4 is a plan view of a lighting device according to a modification of the embodiment.

In the example illustrated in FIGS. 1 and 2, the width of the connecting portion 32 in the short-side direction is smaller than the diameter of the lens bodies 31. However, as illustrated in FIG. 4, the width of the connecting portion 32 in the short-side direction may be larger than the diameter of the lens bodies 31.

Figure 5:
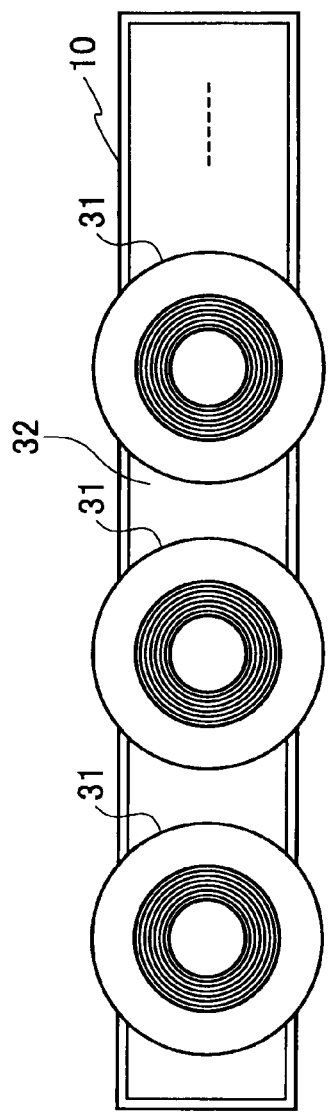
FIG. 5 is a plan view of a lighting device according to another modification of the embodiment, illustrating an example in which a plurality of lens bodies are arranged in line.
Figure 6:
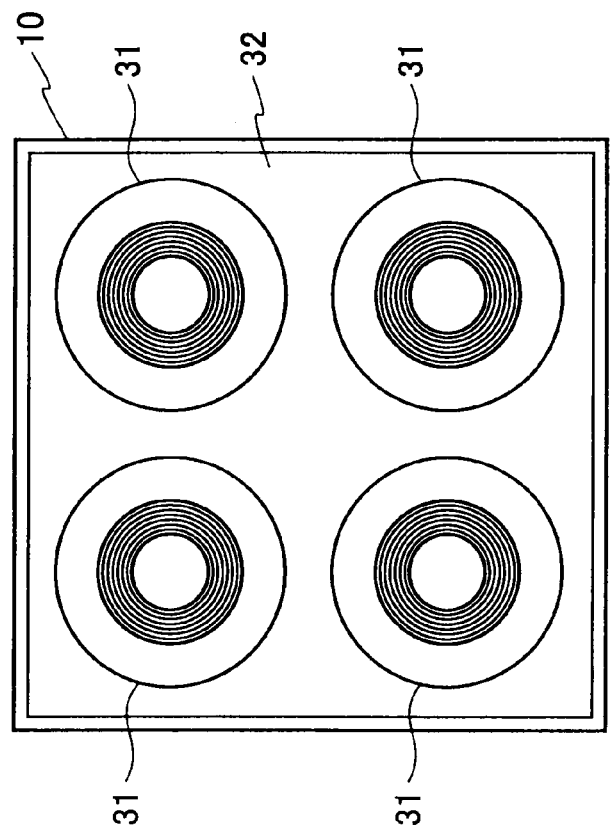
FIG. 6 is a plan view of a lighting device according to still another modification of the embodiment, illustrating an example in which a plurality of lens bodies are arranged in a matrix.

Moreover, in the example illustrated in FIGS. 1 and 2, the connecting portion 32 connects the two lens bodies 31. However, it is certain that the number of the lens bodies 31 is not limited to two. For example, as illustrated in FIG. 5, three or more lens bodies 31 may be arranged. Alternatively, as illustrated in FIG. 6, it is possible to arrange the plurality of lens bodies 31 in a matrix.

Other Embodiments

The present invention is described with the embodiment in the above, but it should not be understood that the present invention is limited by the description and drawings constituting a part of this disclosure. From this disclosure, those skilled in the art will understand various substitutions, examples, and operational techniques.

In the example described in the above embodiment, rays of light emitted from the plurality of lens bodies 31 are concentrated in a same direction. However, the rays of light emitted from the plurality of lens bodies 31 may be individually concentrated in different directions. This can increase the range irradiated by the lighting device 1. Moreover, the light emitting surfaces of the light emitting elements 20 are not necessarily in contact with the light incident surfaces 311 of the lens bodies 31. Moreover, the light emitting surfaces of the light emitting elements 20 and the light incident surfaces 311 of the lens bodies 31 may be curved.

As described above, it is certain that the present invention includes various embodiments and the like not described in this disclosure. The technical scope of the present invention is therefore determined by the features of the present invention according to the claims which are appropriate based on the above description.

What is claimed is:

1. A lighting device, comprising:
a plurality of bulk-type lens bodies, each including a light incident surface on which light emitted from a light emitting element is incident, a light exit surface which is opposite to the light incident surface and is provided with a ring-shaped leading lens at the outer periphery, and an lateral portion connecting the light incident surface and the light exit surface; and
a connecting portion connecting the plurality of lens bodies and including a first major surface and a second major surface opposite to the first major surface, the first major surface being in contact with the lateral portion at a first contact under an outer edge of the leading lens, the second major surface being in contact with the lateral portion at a second contact located below the first contact, wherein
the first contact is located outside of a point of intersection along the first major surface with respect to the center of each lens body, the point of intersection at which an extraction of the first major surface intersects with an extension of a ray of the emitted light which is incident on the light incident surface and is projected on the second contact.

2. The lighting device of claim 1, wherein the light emitting element is a light emitting diode.

3. The lighting device of claim 1, wherein the emitted light which enters the lens body through the light incident surface is projected onto any one of the light exit surface and the lateral portion.

4. The lighting device of claim 1, wherein
an angle between an outer side of the lateral portion and the first major surface is not less than 90 degrees at the first contact point, and
an angle between an outer side of the lateral portion and the second major surface is not less than 90 degrees at the first contact point.

* * * * *